United States Patent
Lay

(10) Patent No.: US 12,354,909 B2
(45) Date of Patent: Jul. 8, 2025

(54) SEMICONDUCTOR DEVICE WITH POROUS SPACER MADE OF LOW-K MATERIAL AND MANUFACTURING METHOD THEREOF

(71) Applicant: NANYA TECHNOLOGY CORPORATION, New Taipei (TW)

(72) Inventor: Chao-Wen Lay, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 18/470,410

(22) Filed: Sep. 19, 2023

(65) Prior Publication Data
US 2024/0006232 A1    Jan. 4, 2024

Related U.S. Application Data

(62) Division of application No. 17/450,833, filed on Oct. 14, 2021, now Pat. No. 11,804,404.

(51) Int. Cl.
| | |
|---|---|
| *G11C 5/06* | (2006.01) |
| *H01L 21/768* | (2006.01) |
| *H01L 23/528* | (2006.01) |
| *H01L 23/532* | (2006.01) |
| *H10B 12/00* | (2023.01) |

(52) U.S. Cl.
CPC ........ *H01L 21/76837* (2013.01); *G11C 5/063* (2013.01); *H01L 21/76828* (2013.01); *H01L 23/5283* (2013.01); *H01L 23/5329* (2013.01); *H10B 12/482* (2023.02)

(58) Field of Classification Search
CPC ......... H01L 21/76828; H01L 21/76837; H01L 23/5329; G11C 5/063; H10B 12/482; H10B 12/485
USPC ........................................ 257/906, 907, 908
See application file for complete search history.

(56) References Cited

U.S. PATENT DOCUMENTS

| | | | |
|---|---|---|---|
| 9,536,980 B1 * | 1/2017 | Huang | ............... H01L 29/6653 |
| 2014/0231892 A1 | 8/2014 | Song et al. | |
| 2018/0269211 A1 * | 9/2018 | Kim | ........................ H01L 28/91 |
| 2019/0296024 A1 * | 9/2019 | Ji | ........................ H10B 12/488 |

\* cited by examiner

*Primary Examiner* — Hoai V Pham
(74) *Attorney, Agent, or Firm* — CKC & Partners Co., LLC

(57) ABSTRACT

A semiconductor device includes a semiconductor structure including a conductive feature therein, a bitline over the semiconductor structure, a spacer on a sidewall of the bitline, wherein the first spacer is made of SiCO, a dielectric layer over a top surface of the bitline; and a contact in contact with the dielectric layer and the spacer and connected to the conductive feature of the semiconductor structure.

5 Claims, 22 Drawing Sheets

SEMICONDUCTOR DEVICE WITH POROUS SPACER MADE OF LOW-K MATERIAL AND MANUFACTURING METHOD THEREOF

CROSS-REFERENCE TO RELATED APPLICATION

The present application is a Divisional Application of the U.S. application Ser. No. 17/450,833, filed Oct. 14, 2021, all of which are herein incorporated by reference in its entirety.

BACKGROUND

Field of Disclosure

The present disclosure relates to a semiconductor device and a manufacturing method thereof. More particularly, the present disclosure relates to a spacer and a manufacturing method thereof.

Description of Related Art

A variety of semiconductor memory devices are used extensively in many consumer products. Illustrative examples of such memory devices include dynamic random access memory (DRAM) and flash memory devices. As the semiconductor technology has progressed into nanoscale technology, the sizes of the semiconductor memory devices and the components therein are gradually reduced. It is desirable to provide improved isolation structures that can be disposed within a memory array for isolating conductive elements.

SUMMARY

In accordance with some embodiments of the present disclosure, a manufacturing method of a semiconductor device includes forming a bitline on a semiconductor structure comprising a conductive feature therein. A spacer is formed adjacent to a sidewall of the bitline, and the spacer has a dielectric contact in a range of about 2 to about 3. A sacrificial layer is formed over the semiconductor structure and covering the spacer. A portion of the sacrificial layer over the bitline is etched to form a first trench to expose a top surface of the bitline. A dielectric layer is formed in the first trench and over the bitline. After forming the dielectric layer, a remaining portion of the sacrificial layer is removed to form a second trench over the semiconductor structure and an outer sidewall of the first spacer is exposed. A contact is formed in the second trench and connected to the conductive feature of the semiconductor structure.

In accordance with some embodiments of the present disclosure, the method further includes etching a portion of a second dielectric layer over the semiconductor structure to expose the semiconductor features in the semiconductor structure before forming the contact in the second trench.

In accordance with some embodiments of the present disclosure, the first spacer is made of SiCO.

In accordance with some embodiments of the present disclosure, the first spacer has a carbon concentration in a range from 10% to 20%.

In accordance with some embodiments of the present disclosure, removing the remaining portion of the sacrificial layer is performed by an etching process that has an etching selectivity between the first spacer and the sacrificial layer.

In accordance with some embodiments of the present disclosure, removing the remaining portion of the sacrificial layer comprises using an oxygen plasma to etch the remaining portion of the sacrificial layer.

In accordance with some embodiments of the present disclosure, the sacrificial layer comprises carbon.

In accordance with some embodiments of the present disclosure, the spacer is a porous material layer.

In accordance with some embodiments of the present disclosure, forming the first spacer includes conformally forming a dielectric material on the sidewall and a top surface of the bitline, and removing a portion of the dielectric material over the bitline to form the first spacer.

In accordance with some embodiments of the present disclosure, forming the first spacer further includes adding porogens in the dielectric material when conformally forming a dielectric material on the sidewall and a top surface of the bitline.

In accordance with some embodiments of the present disclosure, the method further includes heating the spacer to remove the porogens in the dielectric material to form voids in the dielectric material after removing the remaining portion of the sacrificial layer.

In accordance with some embodiments of the present disclosure, heating the first spacer is further performed prior to forming the contact.

In accordance with some embodiments of the present disclosure, the heating the first spacer is performed at a temperature in a range from 350° C. to 400° C.

In accordance with some embodiments of the present disclosure, forming the contact includes filling a first conductive material in the second trench. The first conductive material is etched back. A second conductive material is formed over the first conductive material and in the second trench to form the contact.

In accordance with some embodiments of the present disclosure, a semiconductor device includes a semiconductor structure including a conductive feature therein, a bitline over the semiconductor structure, a spacer on a sidewall of the bitline, wherein the first spacer is made of SiCO, a dielectric layer over a top surface of the bitline; and a contact in contact with the dielectric layer and the spacer and connected to the conductive feature of the semiconductor structure.

In accordance with some embodiments of the present disclosure, the spacer has voids therein.

In accordance with some embodiments of the present disclosure, the spacer is a single layer.

In accordance with some embodiments of the present disclosure, the spacer has a thickness in a range from 4 nm to 8 nm.

In accordance with some embodiments of the present disclosure, a dielectric constant of the spacer is in a range from 2 to 3.

In accordance with some embodiments of the present disclosure, the first spacer has a carbon concentration in a range from 10% to 20%.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
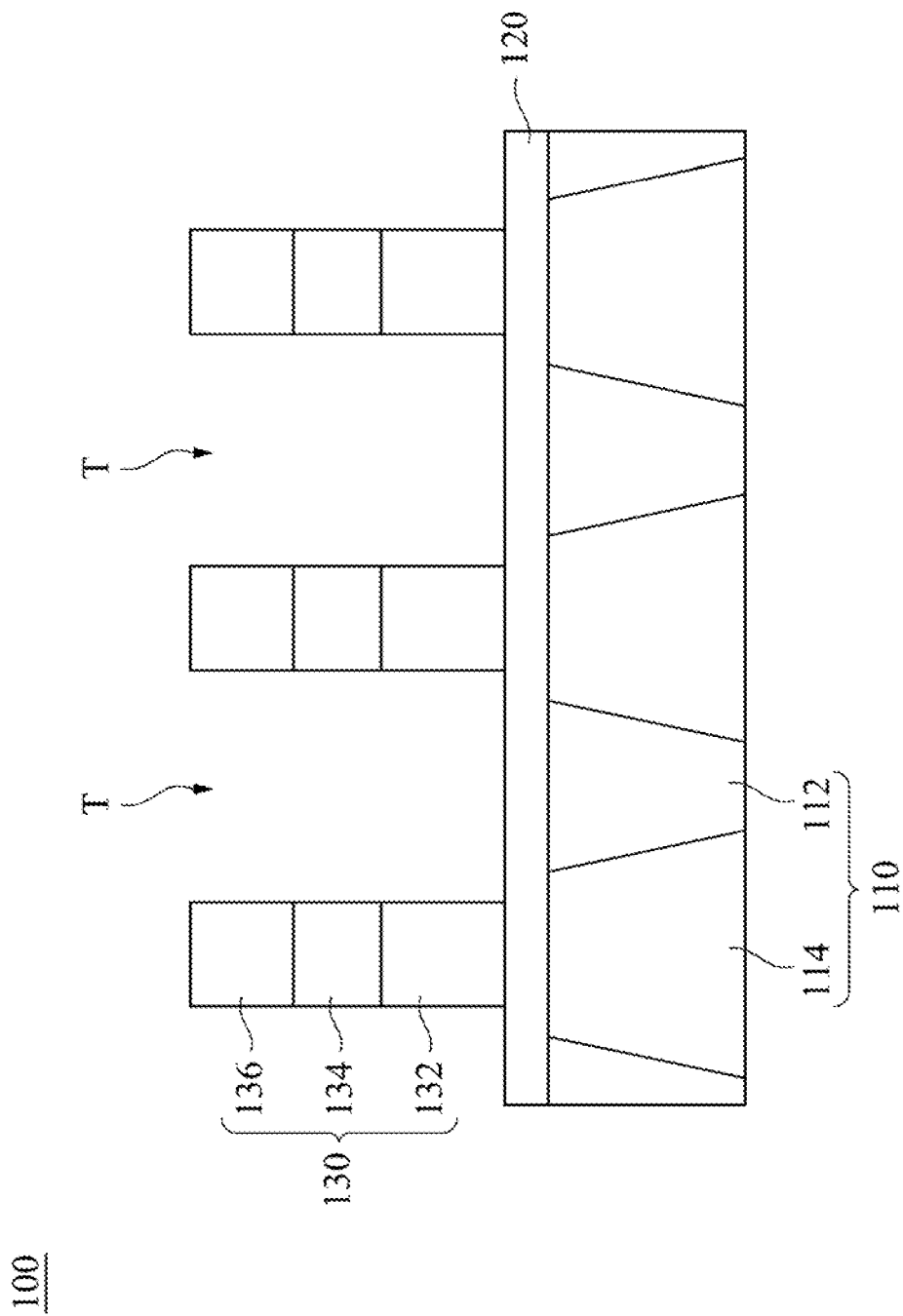
FIGS. 1-8C illustrate cross-sectional views of intermediate stages in the manufacturing process of a semiconductor device in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

Some embodiments of the present disclosure can achieve manufacturing methods of spacers made of low-k materials. More specifically, the spacers are made of SiCO or porous materials. Low-K spacers can cut active power consumption and have the potential to improve performance through reductions in parasitic capacitances.

FIGS. 1-8C illustrate cross-sectional views of intermediate stages in the manufacturing process of a semiconductor device 100 in accordance with some embodiments of the present disclosure. Referring to FIG. 1, a semiconductor structure 110 is provided. The semiconductor structure 110 includes conductive features 112 and isolation structures 114 between the conductive features 112. The conductive features 112 may be any suitable components, such as active regions of the semiconductor device 100, or the like. The isolation structures 114 may be shallow trench isolation (STI) structures in some embodiments. In some embodiments, the conductive features 112 are made of silicon. The isolation structures 114 may be dielectric materials to electrically isolate the conductive features 112. In some embodiments, the conductive features 112 and the isolation structures 114 are disposed over a substrate.

A first dielectric layer 120 is formed on the semiconductor structure 110 including the conductive features 112, and then a plurality bitlines 130 are formed over the first dielectric layer 120. Two adjacent bitlines 130 are separated by a trench T. Each of the bitlines 130 includes a semiconductor layer 132, a conductive layer 134 and a second dielectric layer 136 from bottom to top. Therefore, the semiconductor layer 132 is over the first dielectric layer 120, the conductive layer 134 is over the semiconductor layer 132, and the second dielectric layer 136 is over the conductive layer 134. In some embodiments, the first dielectric layer 120 includes oxides, e.g., silicon oxide. The semiconductor layer 132 may include any suitable semiconductor materials. In some embodiments, the semiconductor layer 132 includes semiconductive materials, e.g., poly crystalline silicon. The conductive layer 134 may include any suitable conductive materials, such as metals. In some embodiments, the conductive layer 134 includes tungsten. The second dielectric layer 136 may include any suitable dielectric materials. In some embodiments, the second dielectric layer 136 includes nitrides, e.g., silicon nitride.

More specifically, the manufacturing method of the bitlines 130 includes forming the first dielectric layer 120, a semiconductor material layer, a conductive material layer and a dielectric material layer over the semiconductor structure 110 in sequence. The semiconductor material layer, the conductive material layer and the dielectric material layer are then patterned by a photomask to form the bitlines 130 including the semiconductor layer 132, the conductive layer 134 and the second dielectric layer 136. The semiconductor material layer, the conductive material layer and the dielectric material layer may be formed by any suitable process, such as physical vapor deposition (PVD), chemical vapor deposition (CVD), atomic layer deposition (ALD) or the like and may be patterned by photolithography.

Figure 2:
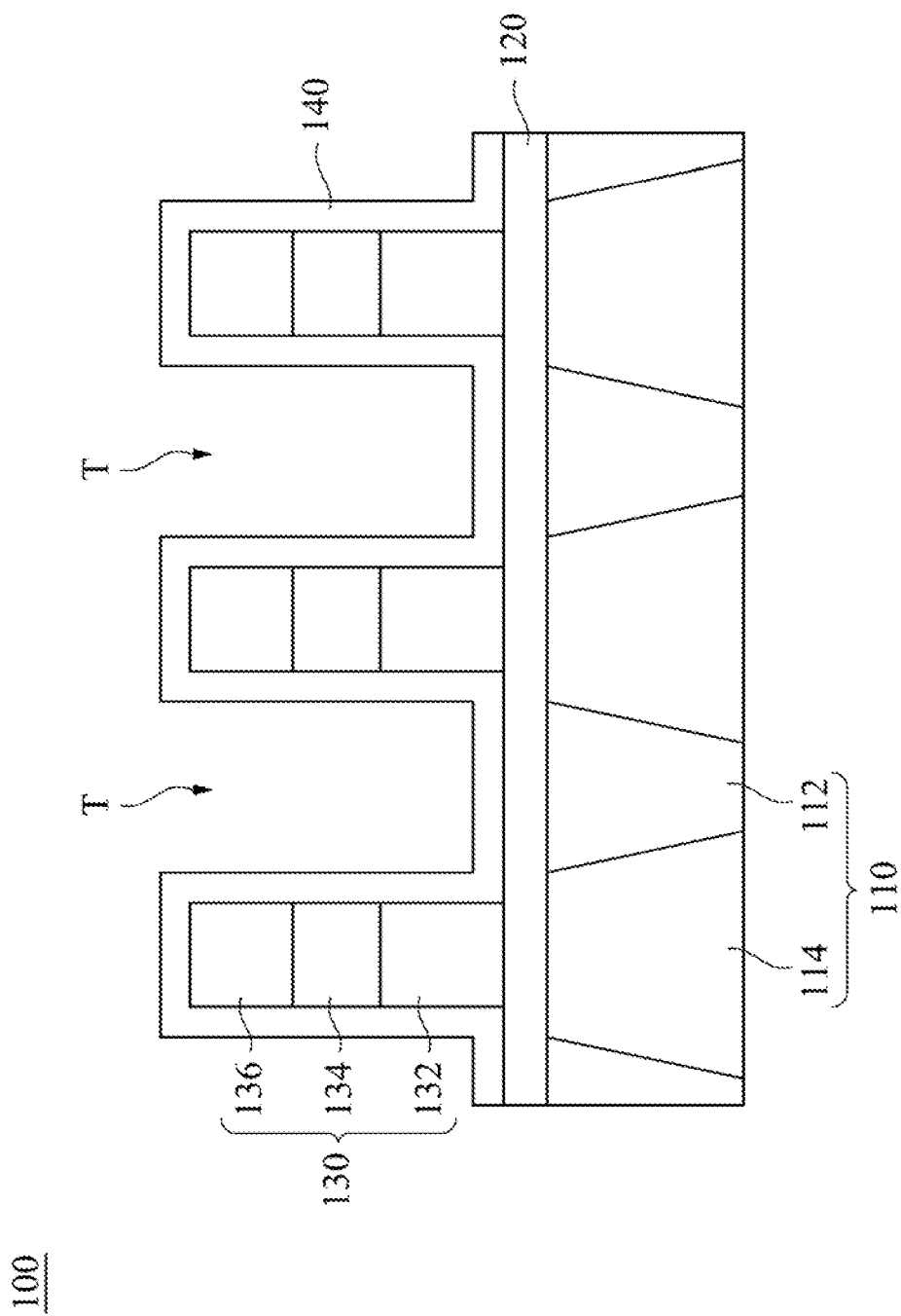

Referring to FIG. 2, a spacer layer 140 is conformally formed over the semiconductor structure 110 and the bitlines 130. Forming the spacer layer 140 includes depositing a dielectric material on the sidewalls and the top surface of the bitlines 130. In some embodiments, the dielectric material is the mixture of SiO and carbon, i.e. SiO and carbon are well-mixed prior to deposition and are deposited at the same operation; therefore, the spacer layer 140 made of SiCO is formed over the semiconductor structure 110 and the bitlines 130. The addition of carbon may lower the dielectric constant of the spacer layer 140 and the subsequently formed spacers (such as spacers 142 in FIG. 3). Because the spacer layer 140 is made of SiCO, which is deposited in a single process, the spacer layer 140 is a single piece of continuous material and no obvious interface is existed in the spacer layer 140. In some embodiments, the carbon concentration in the spacer layer 140 is in a range about 10% to about 20%. The overall dielectric constant of the resulting spacer layer 140 is in a range from about 2 to about 3. In some embodiments, the spacer layer 140 is deposited by CVD, PVD, ALD or the like. In some embodiments, the thickness of the spacer layer 140 is in a range of about 4 nm to about 8 nm.

Figure 3:
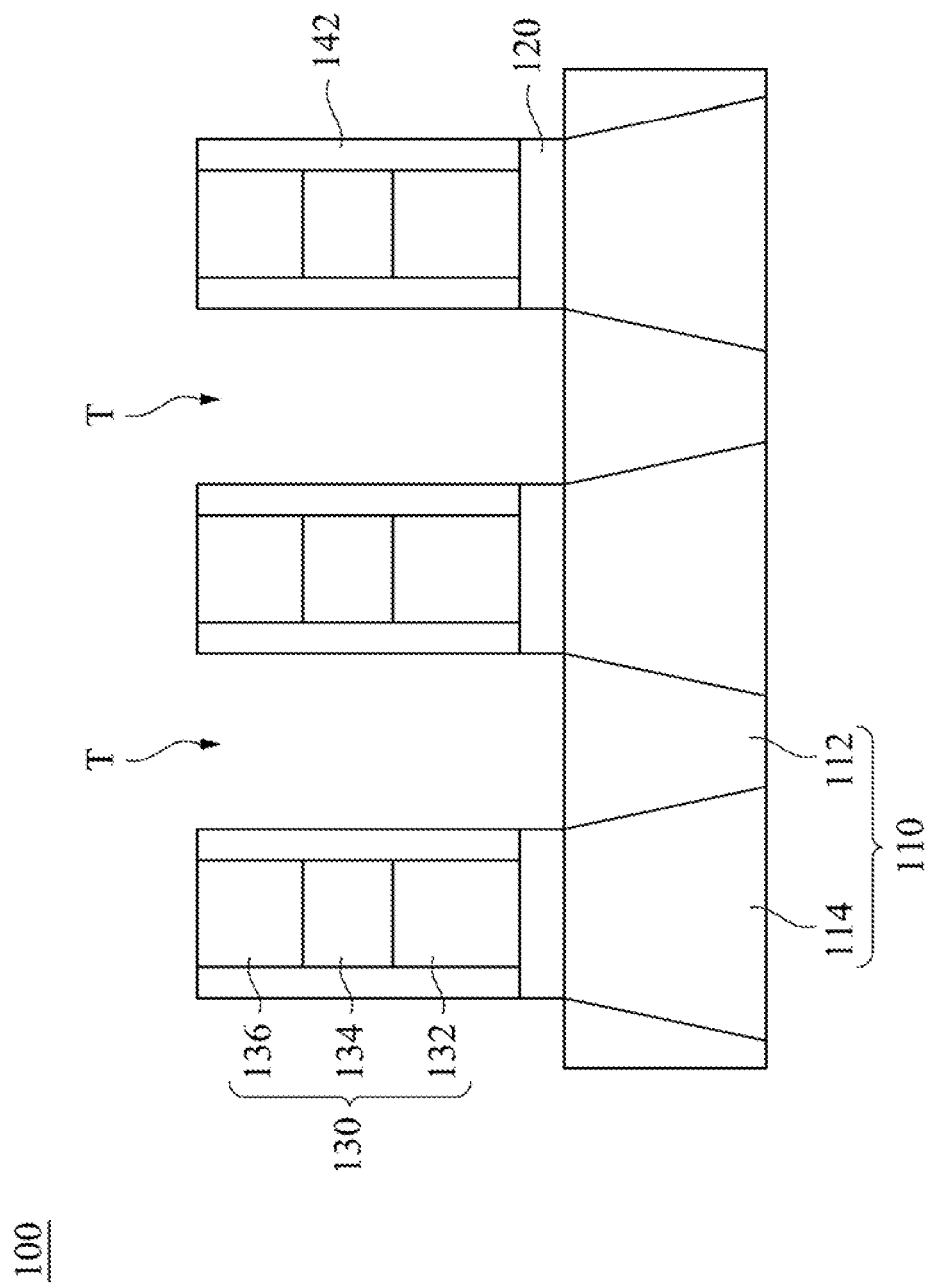

Referring to FIG. 3, portions of the spacer layer 140 over the top surfaces of the bitlines 130 are removed and portions of the spacer layer 140 over the semiconductor structure 110 are removed to form spacers 142 adjacent to the sidewalls of the bitlines 130. The spacers 142 cover sidewalls of the bitlines 130 to isolate the bitlines 130 from the subsequently formed contacts (such as contacts 170 in FIG. 7). Because the spacer layer 140 is a single piece of continuous material, each of the resulting spacers 142 is a single layer with no obvious interface existed therein. Any suitable process may be used to remove the portions of the spacer layer 140, such as dry etching, wet etching or the like. Because the spacer 142 is formed by removing the portions of the spacer layer 140, the dielectric constant and the carbon concentration of the spacer 142 is the same as the spacer layer 140. The low-k spacers 142 can cut active power consumption and have the potential to improve performance through reductions in parasitic capacitances. Using SiO mixed with carbon to form the spacers 142 can easily form low-k spacers and simplify the process of forming low-k spacers, thereby reducing the manufacturing cost. In some embodiments, the first dielectric layer 120 over the semiconductive features 112 is also removed during removing the portions of the spacer layer 140. Therefore, the semiconductive features 112 are exposed in this operation.

Figure 4:
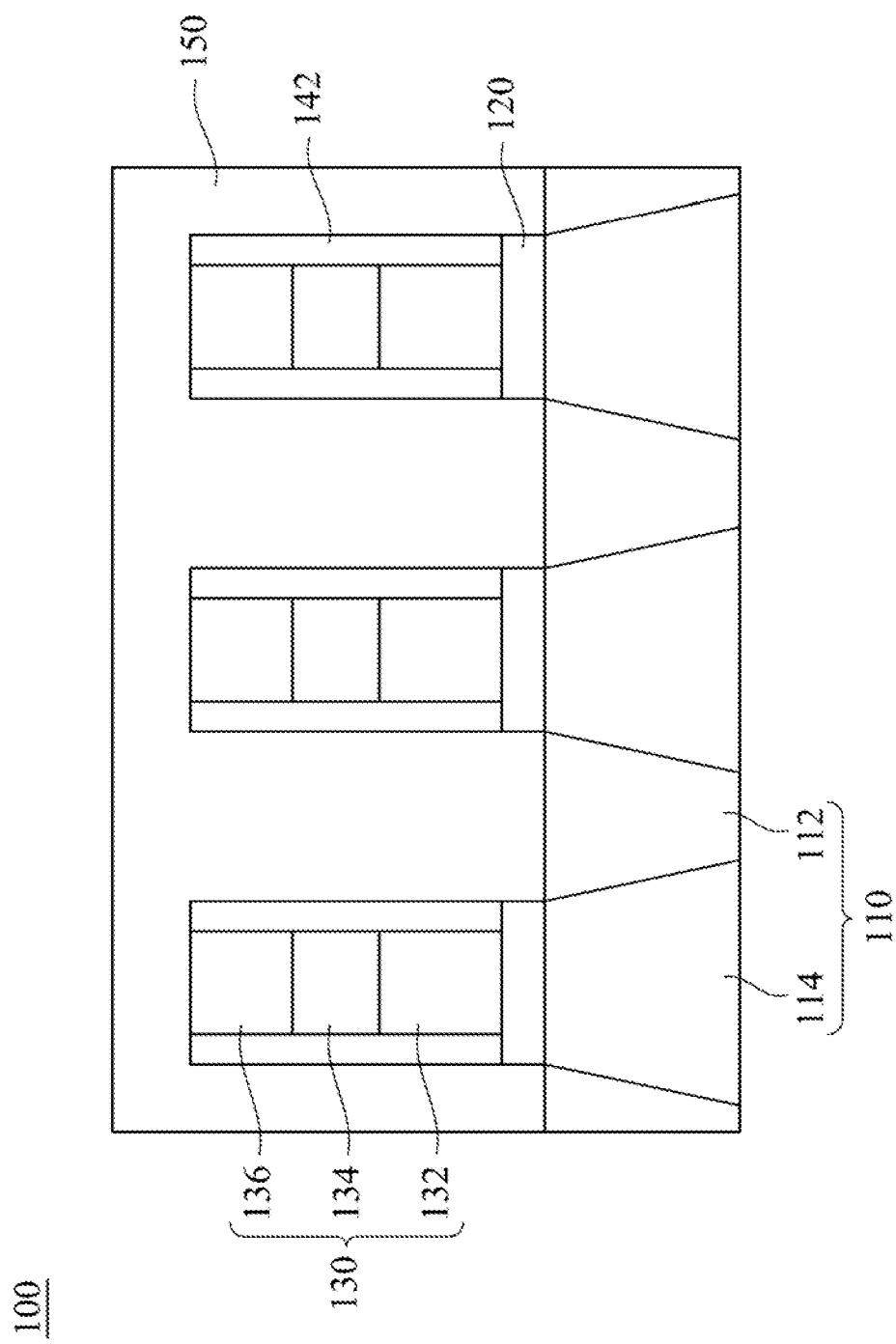

Referring to FIG. 4, a sacrificial layer 150 is formed over the semiconductor structure 110 and covers the spacers 142. The sacrificial layer 150 has an oxygen etching selectivity compared to the spacers 142; hence, in the subsequent process, the sacrificial layer 150 is easily removed while the spacers 142 still remains unetched or only slightly etched. In some embodiments, the sacrificial layer 150 may be made of photoresist containing carbon, and the spacers 142 are good etch stop layers while the sacrificial layer 150 made of photoresist containing carbon is removed due to the oxygen etching selectivity.

Figure 5:
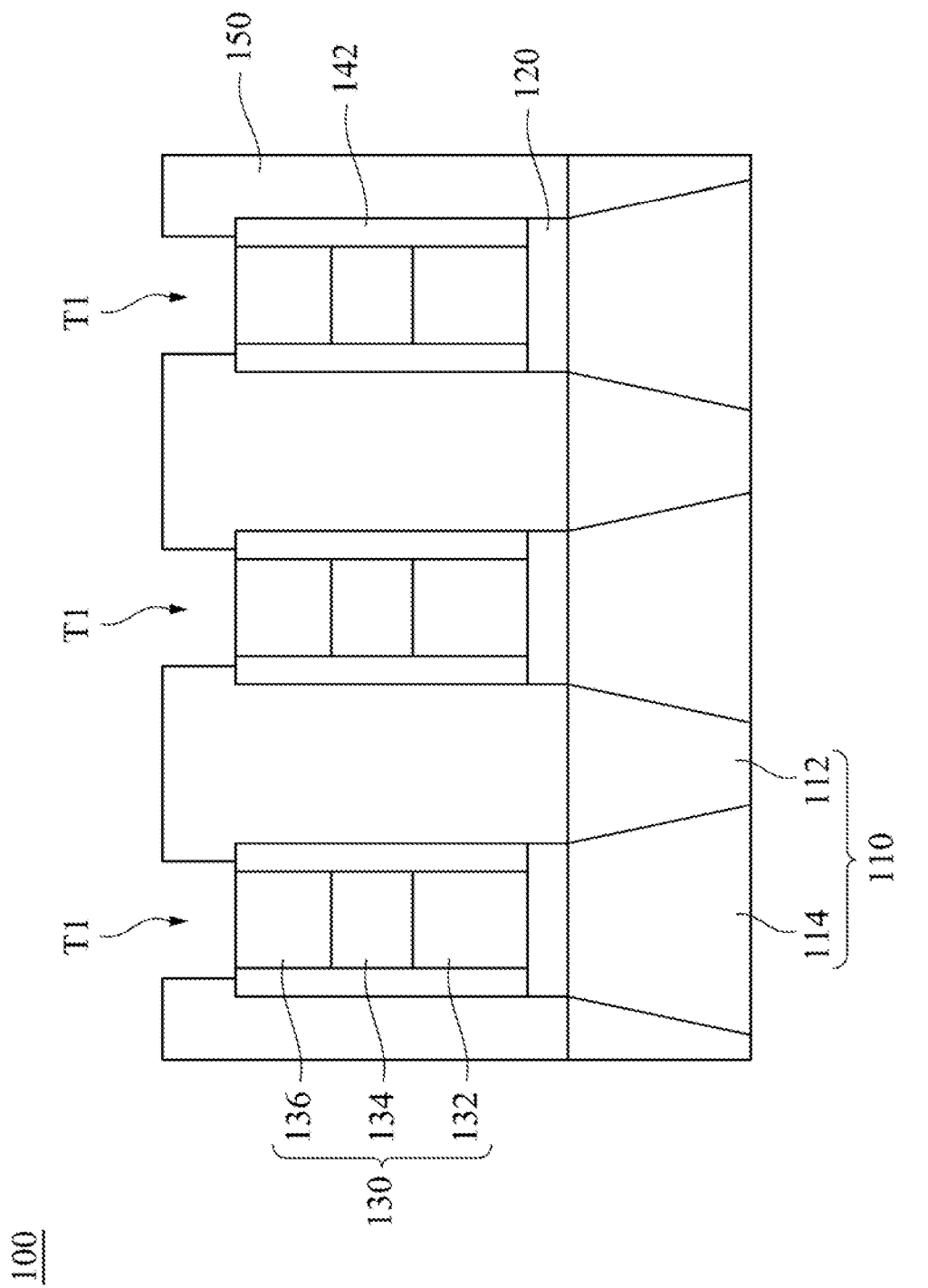

Referring to FIG. 5, a portion of the sacrificial layer 150 over the top surface of the bitlines 130 is etched to form first trenches T1 to expose the top surface of the bitlines 130. Due to the etching selectivity between the sacrificial layer 150 and the second dielectric layer 136, the second dielectric layer 136 is unetched or barely etched in this process. The sacrificial layer 150 may be etched by any suitable process. In some embodiments, the sacrificial layer 150 is etched by oxygen plasma.

Figure 6:
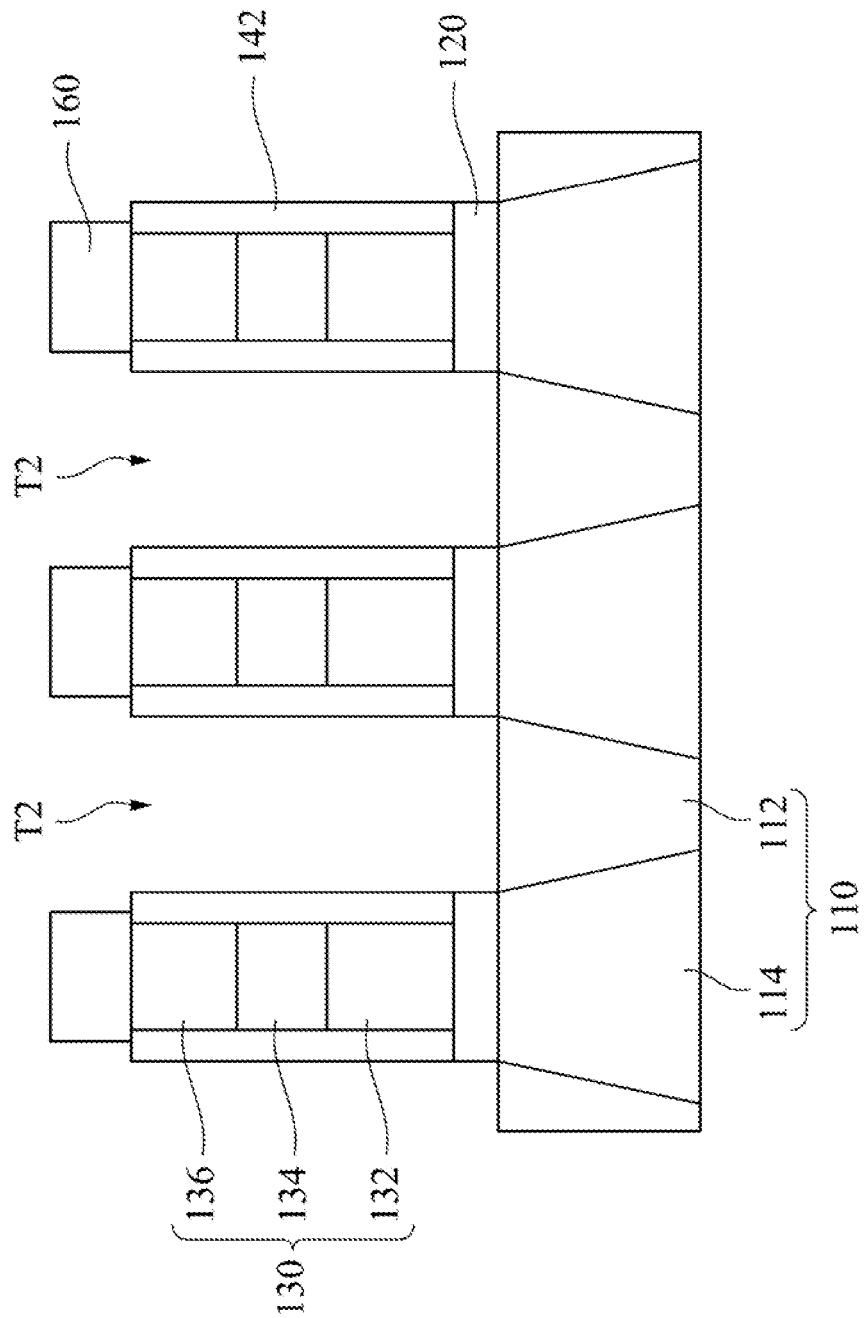

Referring to FIG. 6, dielectric layers 160 are formed in the first trenches T1 (see FIG. 5) over the bitlines 130. The dielectric layers 160 may include any suitable dielectric materials, such as nitride. After forming the dielectric layer 160, a remaining portion of the sacrificial layer 150 is removed to form second trenches T2 over the semiconductor structure 110, thereby exposing outer sidewalls of the spacers 142 and sidewalls of the dielectric layer 160. Due to the oxygen etching selectivity between the sacrificial layer 150 and the spacers 142, the spacers 142 are unetched or barely etched in this process. Therefore, the spacers 142 are not damaged during the removal of the sacrificial layer 150. In some embodiments, oxygen plasma is also used to etch the remaining portion of the sacrificial layer 150. The second trenches T2 expose the semiconductive features 112 in the semiconductor structure 110.

Figure 7:
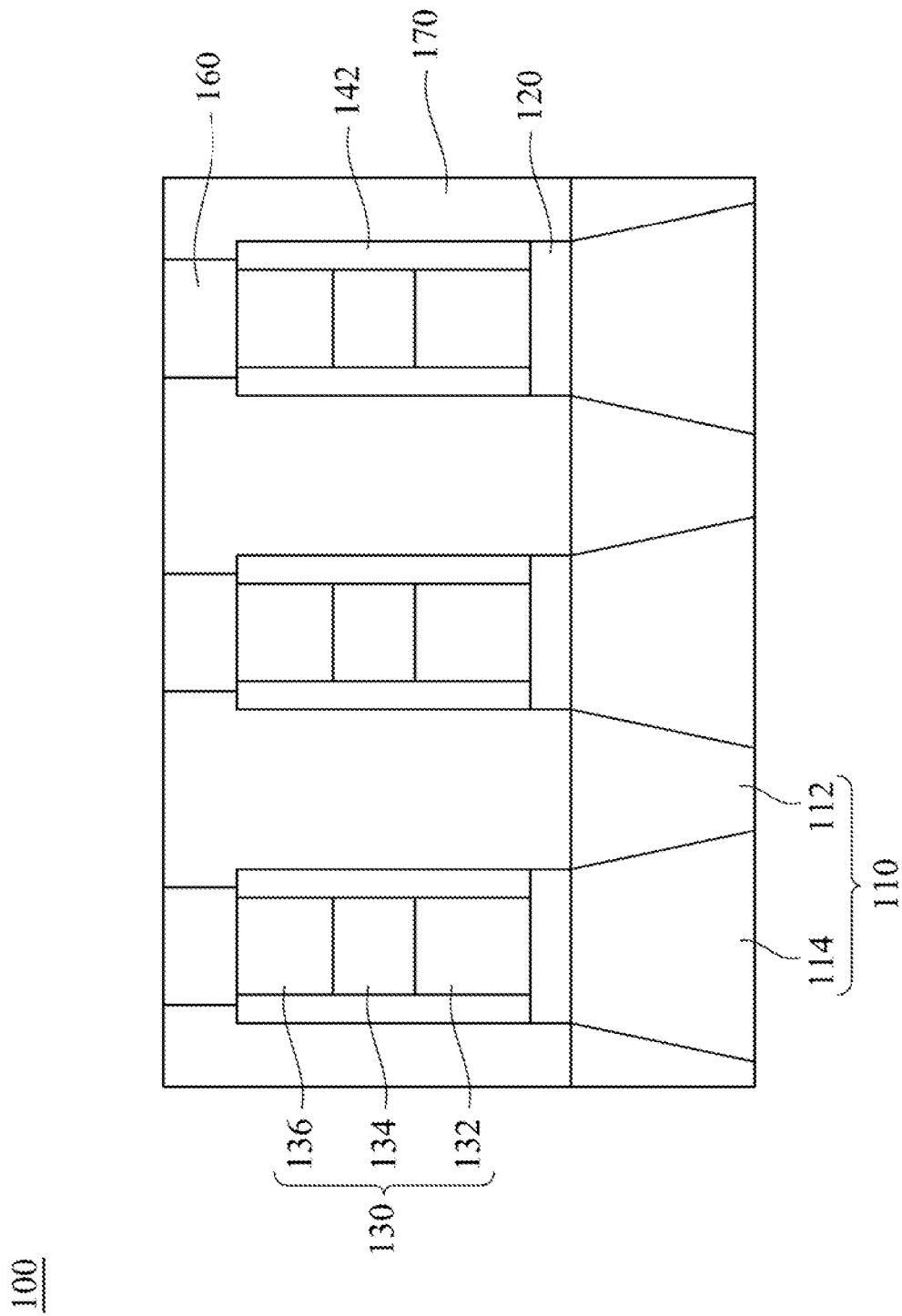
Figure 8A:
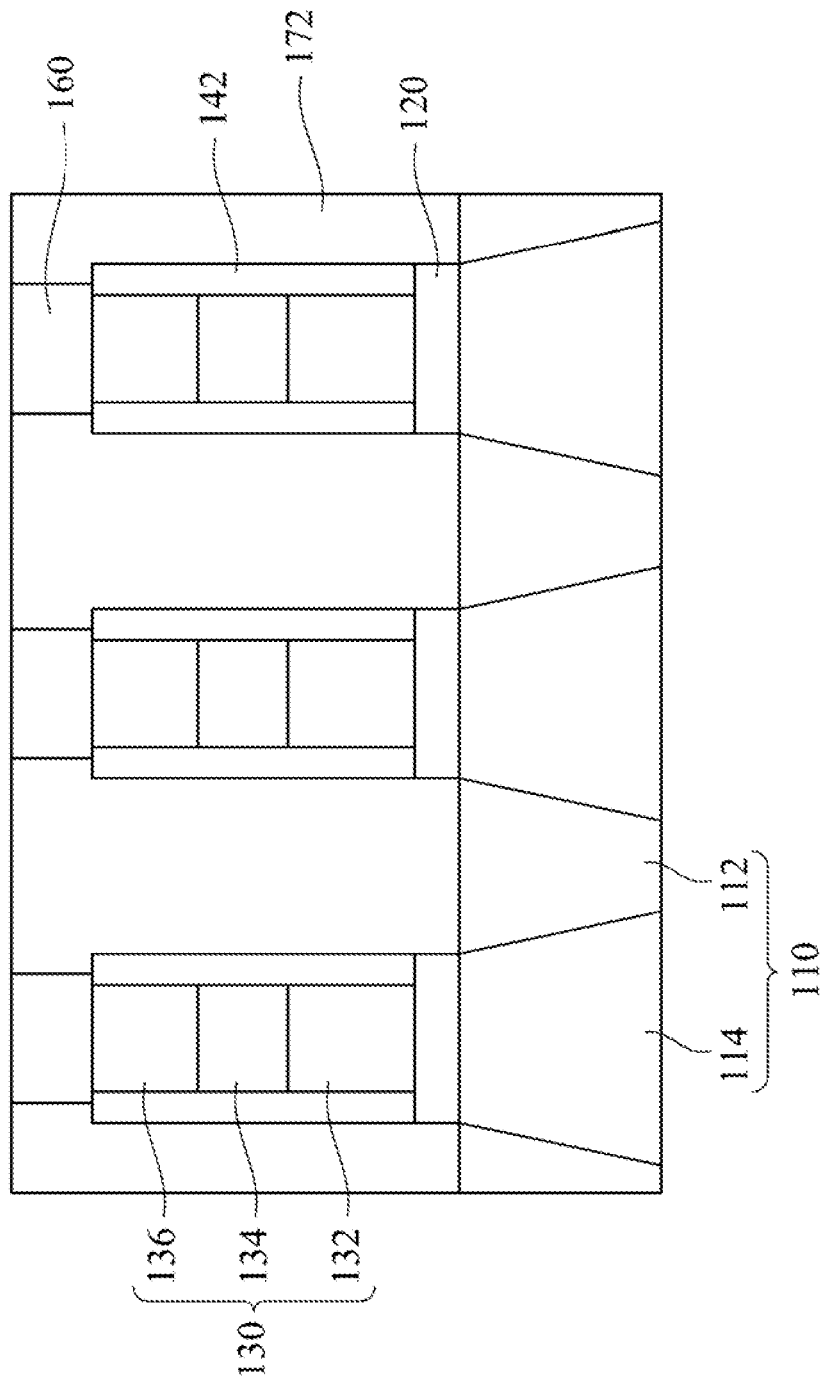
Figure 8B:
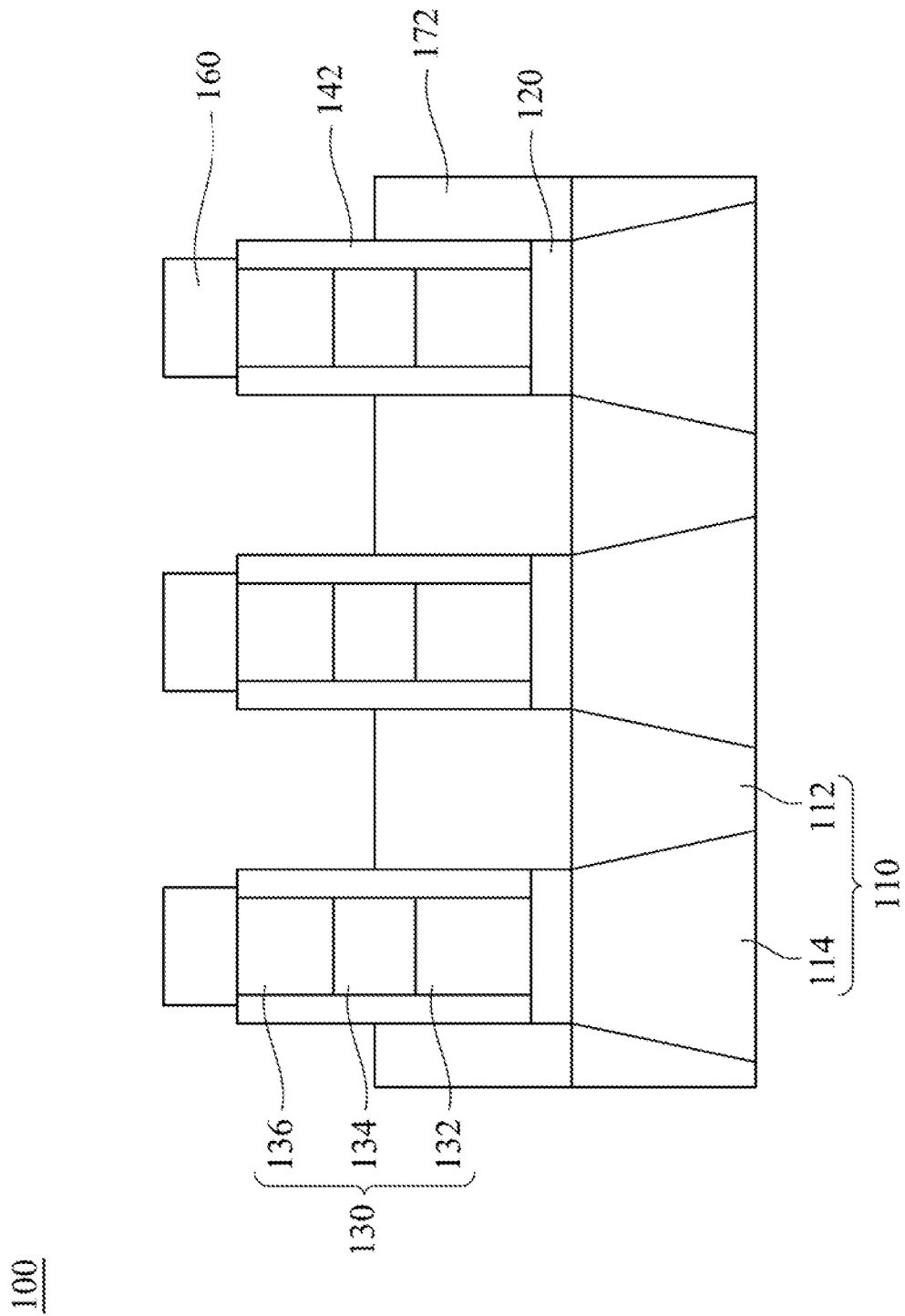
Figure 8C:
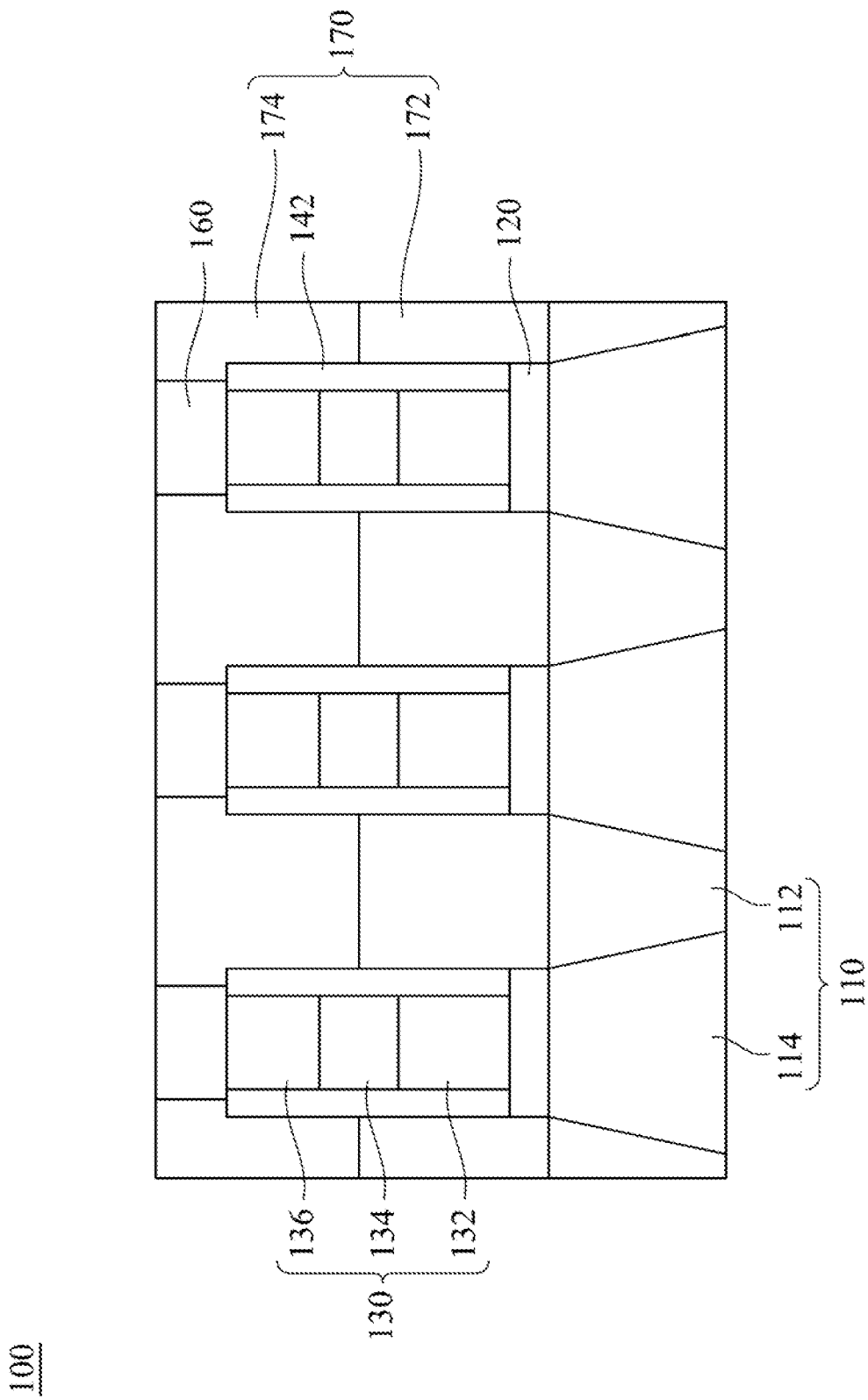
Figure 9:
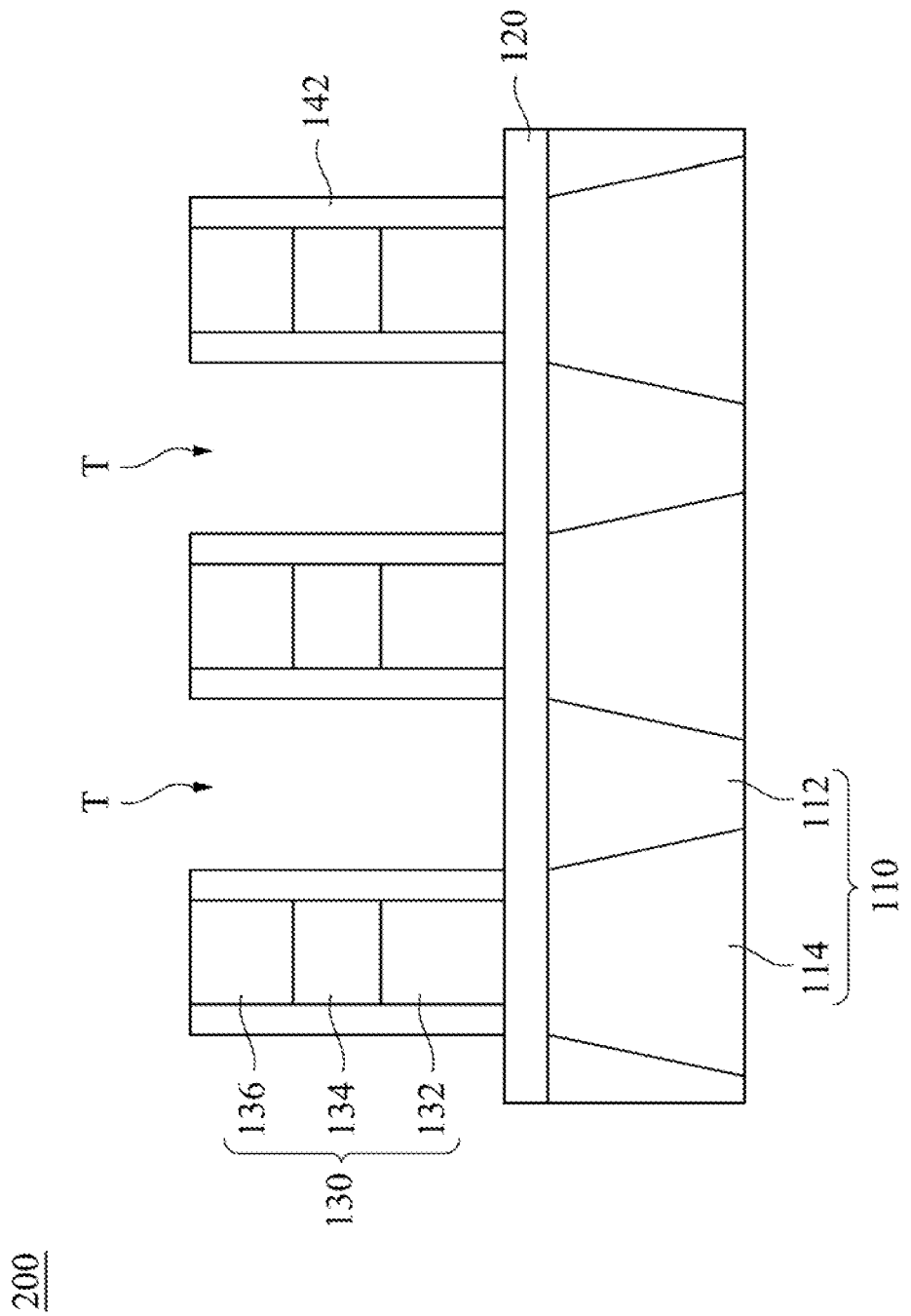
FIGS. 9-13 illustrate cross-sectional views of intermediate stages in the manufacturing process of a semiconductor device in accordance with some embodiments of the present disclosure.

Referring to FIG. 7, contacts 170 are formed in the second trenches T2 and are connected to the conductive feature 112 of the semiconductor structure 110. The adjacent contacts 170 are isolated by the dielectric layers 160. The contacts 170 may be made of any suitable conductive materials (such as metals) or semiconductor materials or combinations thereof. In some embodiments, the contacts 170 include a single conductive material such as metals, as shown in FIG. 7. In some other embodiments, the contacts 170 are made of a combination of a semiconductive material and a conductive material. For examples, forming the contacts 170 includes filling a first conductive material 172 in the second trenches T2. The first conductive material 172 is then etched back. Subsequently, a second conductive material 174 is formed over the first conductive material 174 and in the second trenches T2 to form the contacts 170, as shown in FIGS. 8A-8C.

Figure 10:
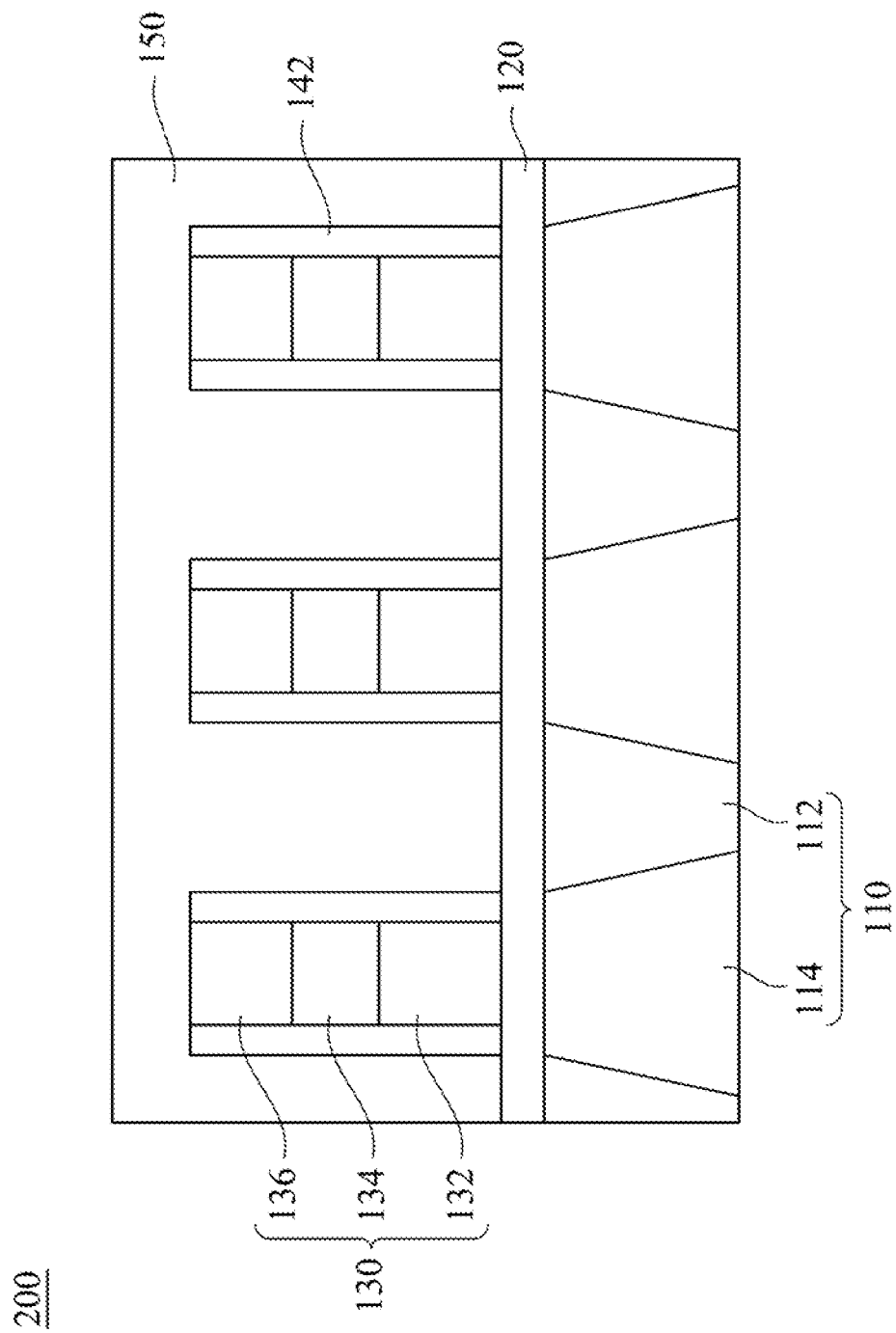

FIGS. 9-13 illustrate cross-sectional views of intermediate stages in the manufacturing process of a semiconductor device 200 in accordance with some embodiments of the present disclosure. The manufacturing process of a semiconductor device 200 is similar to the manufacturing process of a semiconductor device 100. The difference is that, in FIG. 3, the first dielectric layer 120 over the semiconductive features 112 is removed during removing the portions of the spacer layer 140 over the top surface of the bitlines 130 and the semiconductor structure 110 when manufacturing the semiconductor device 100. On the other hand, in FIG. 9, the first dielectric layer 120 over the semiconductive features 112 is not removed during removing the portions of the spacer layer 140 over the top surface of the bitlines 130 and the semiconductor structure 110 when manufacturing the semiconductor device 200. Instead, the sacrificial layer 150 is formed directly after removing portions of the first spacer layer 140 over the top surface of the bitlines 130 and the semiconductor structure 110, so the sacrificial layer 150 is separated from the conductive features 112 by the first dielectric layer 120, as shown in FIG. 10.

Figure 11:
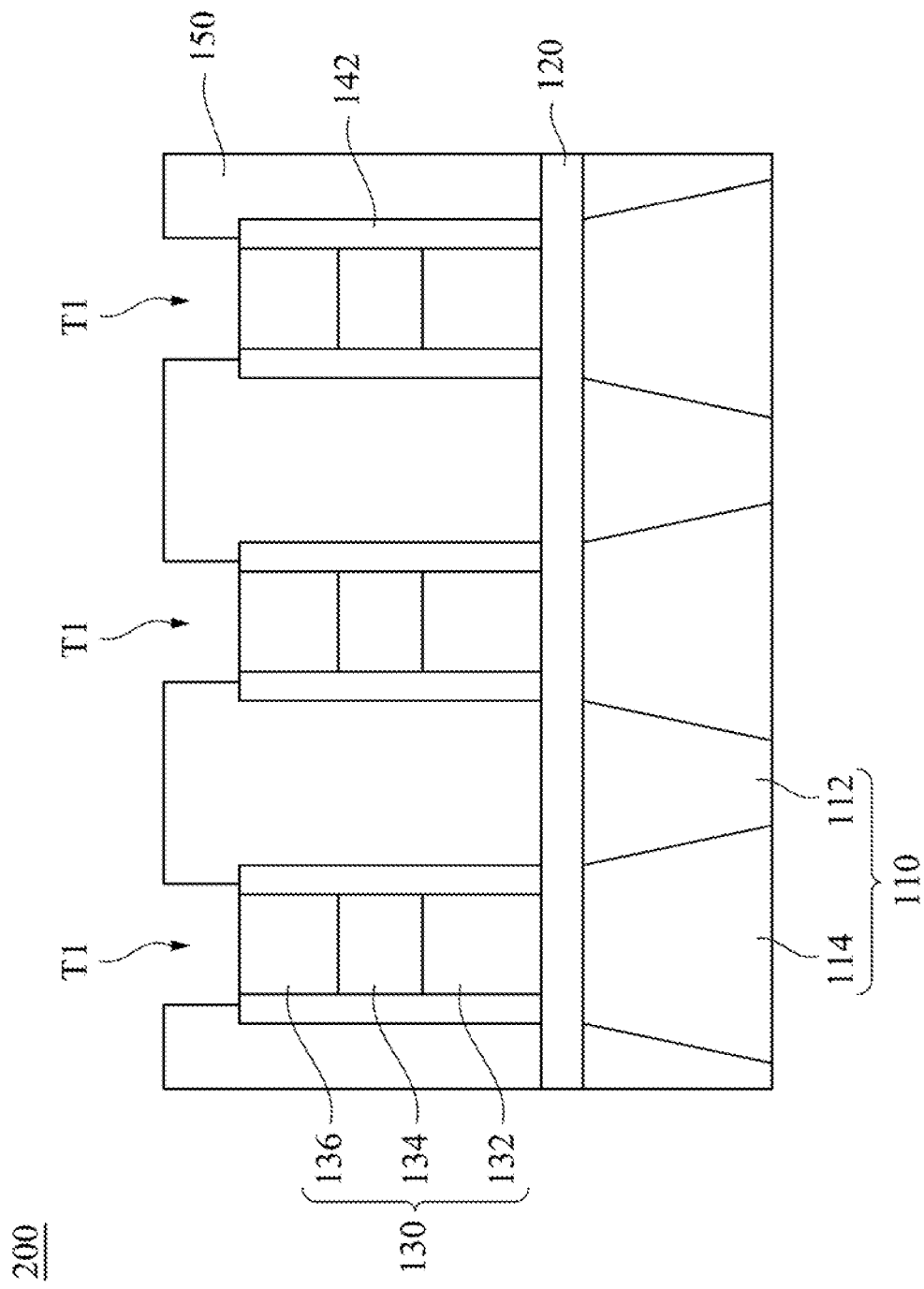

Referring to FIG. 11, a portion of the sacrificial layer 150 over the top surface of the bitlines 130 is etched to form first trenches T1 to expose the top surface of the bitlines 130. Due to the etching selectivity between the sacrificial layer 150 and the second dielectric layer 136, the second dielectric layer 136 is unetched or barely etched in this process. Details related to the process in FIG. 11 are similar to or the same as the process in FIG. 5; therefore, detailed descriptions are not discussed herein.

Figure 12:
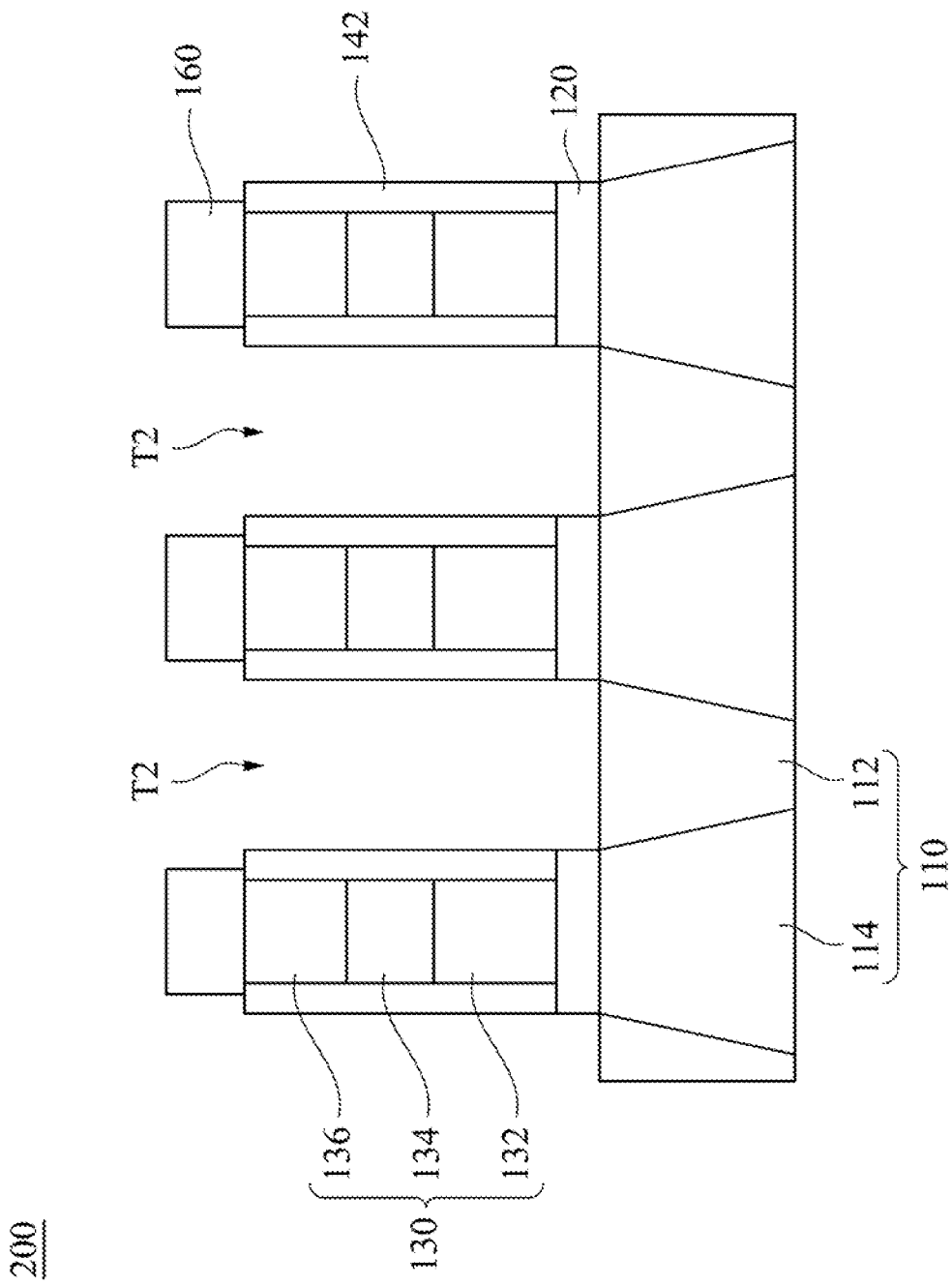

Referring to FIG. 12, dielectric layers 160 are formed in the first trenches T1 (see FIG. 11) over the top surface of the bitlines 130. After forming the dielectric layer 160, a remaining portion of the sacrificial layer 150 is removed to form second trenches T2 over the semiconductor structure 110, thereby exposing outer sidewalls of the spacers 142 and sidewalls of the dielectric layer 160. Due to the oxygen etching selectivity between the sacrificial layer 150 and the spacers 142, the spacers 142 are unetched or barely etched in this process. Therefore, the spacers 142 are not damaged during the removal of the sacrificial layer 150. In some embodiments shown as FIG. 12, the first dielectric layer 120 over the semiconductive features 112 is removed during or after removing the remaining sacrificial layer 150. Therefore, the semiconductive features 112 are exposed in FIG. 12.

Figure 13:
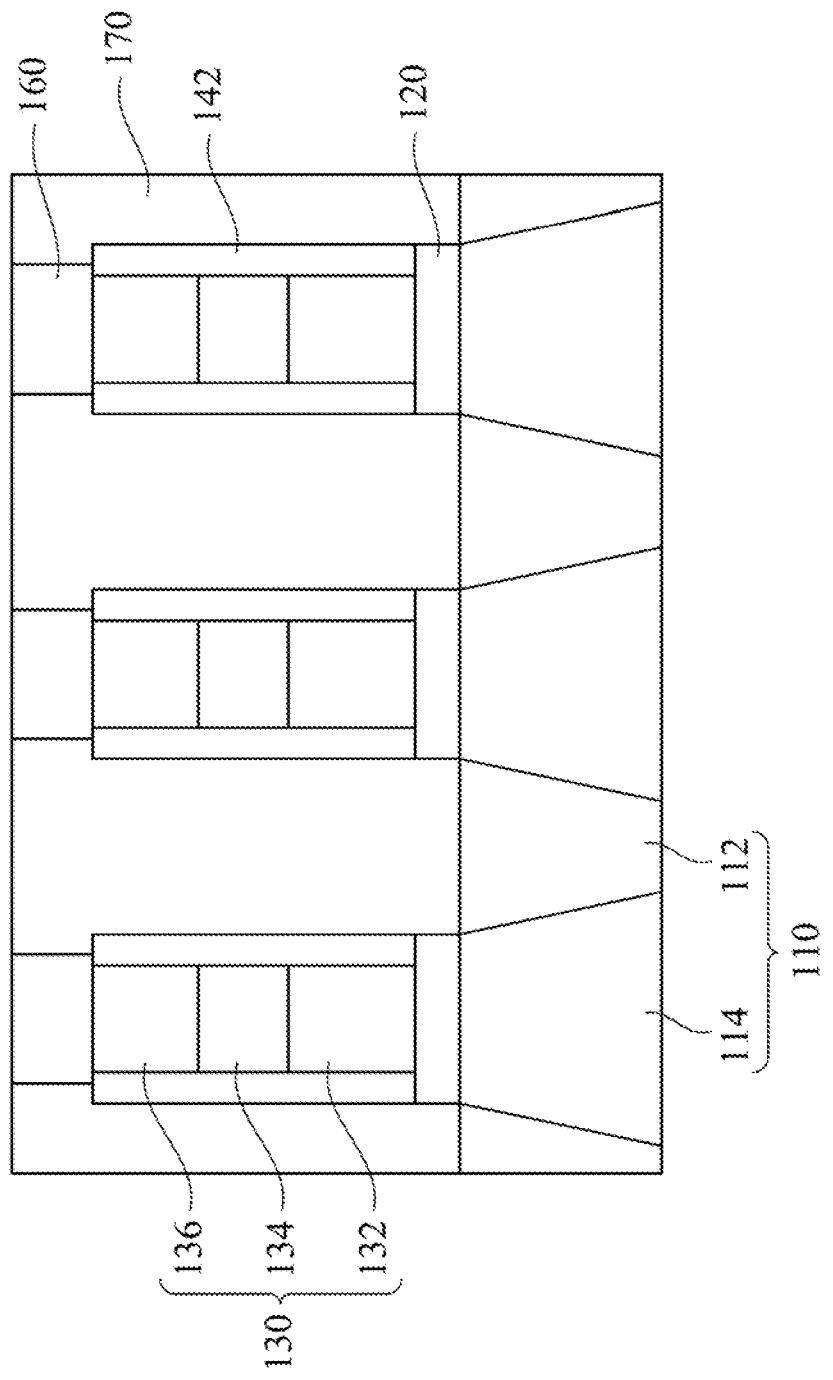
Figure 14:
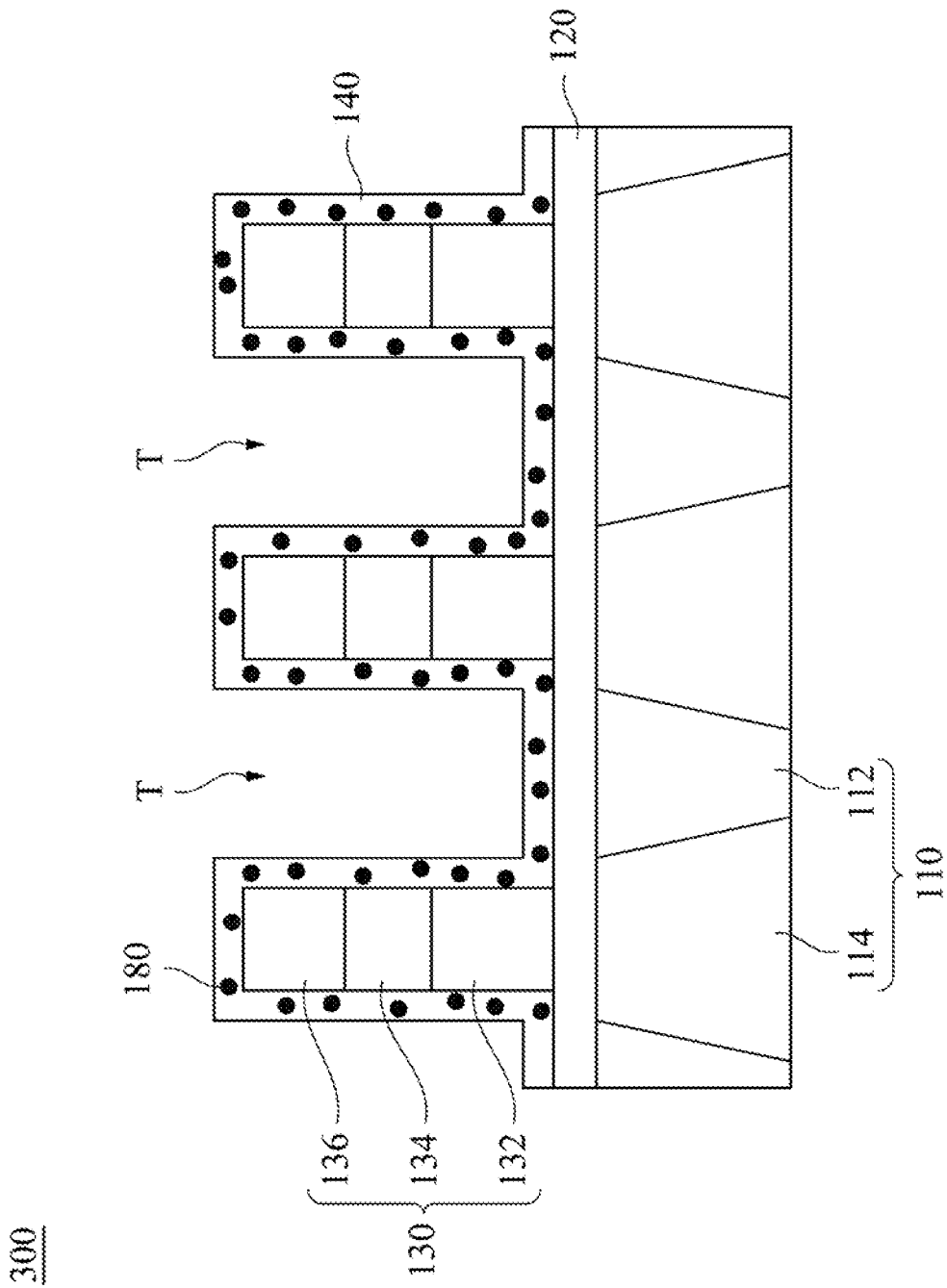
FIGS. 14-20 illustrate cross-sectional views of intermediate stages in the manufacturing process of a semiconductor device in accordance with some embodiments of the present disclosure.

Referring to FIG. 13, contacts 170 are formed in the second trenches T2 (see FIG. 12) and are connected to the conductive features 112 of the semiconductor structure 110. The adjacent contacts 170 are isolated by the dielectric layer 160. Details related to the process in FIG. 12 are similar to or the same as the process in FIG. 7; therefore, detailed descriptions are not discussed herein.

Figure 15:
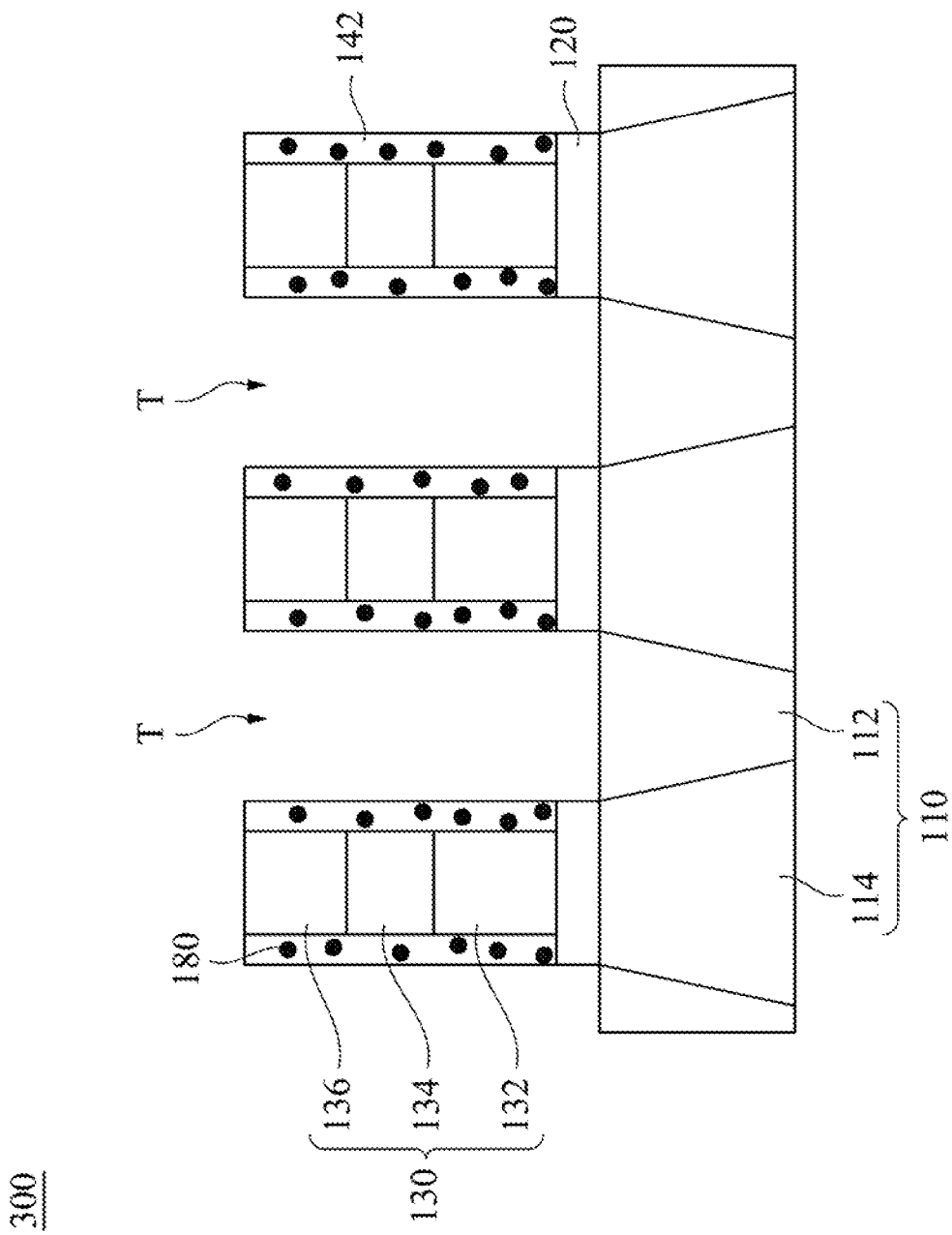
Figure 16:
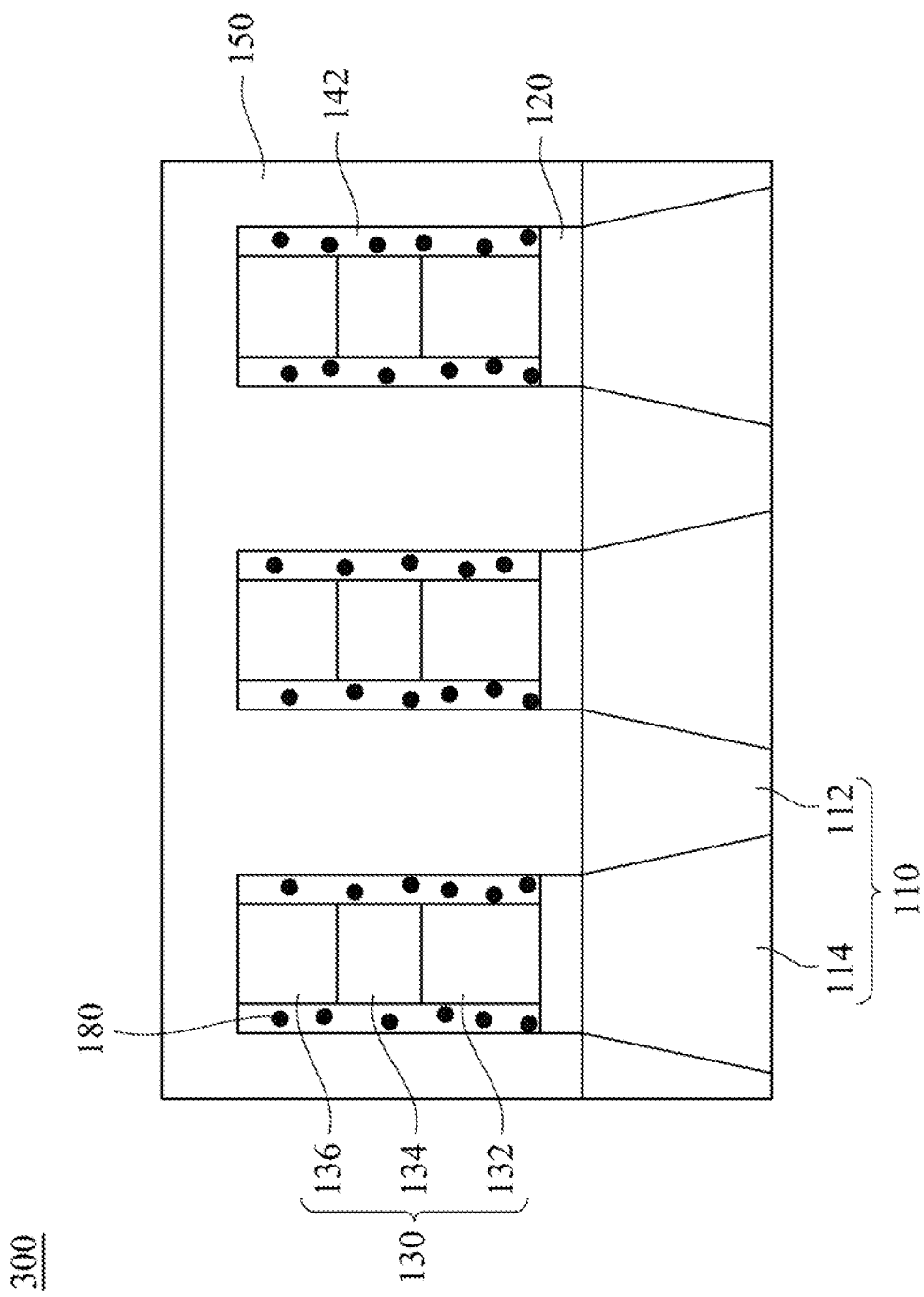
Figure 17:
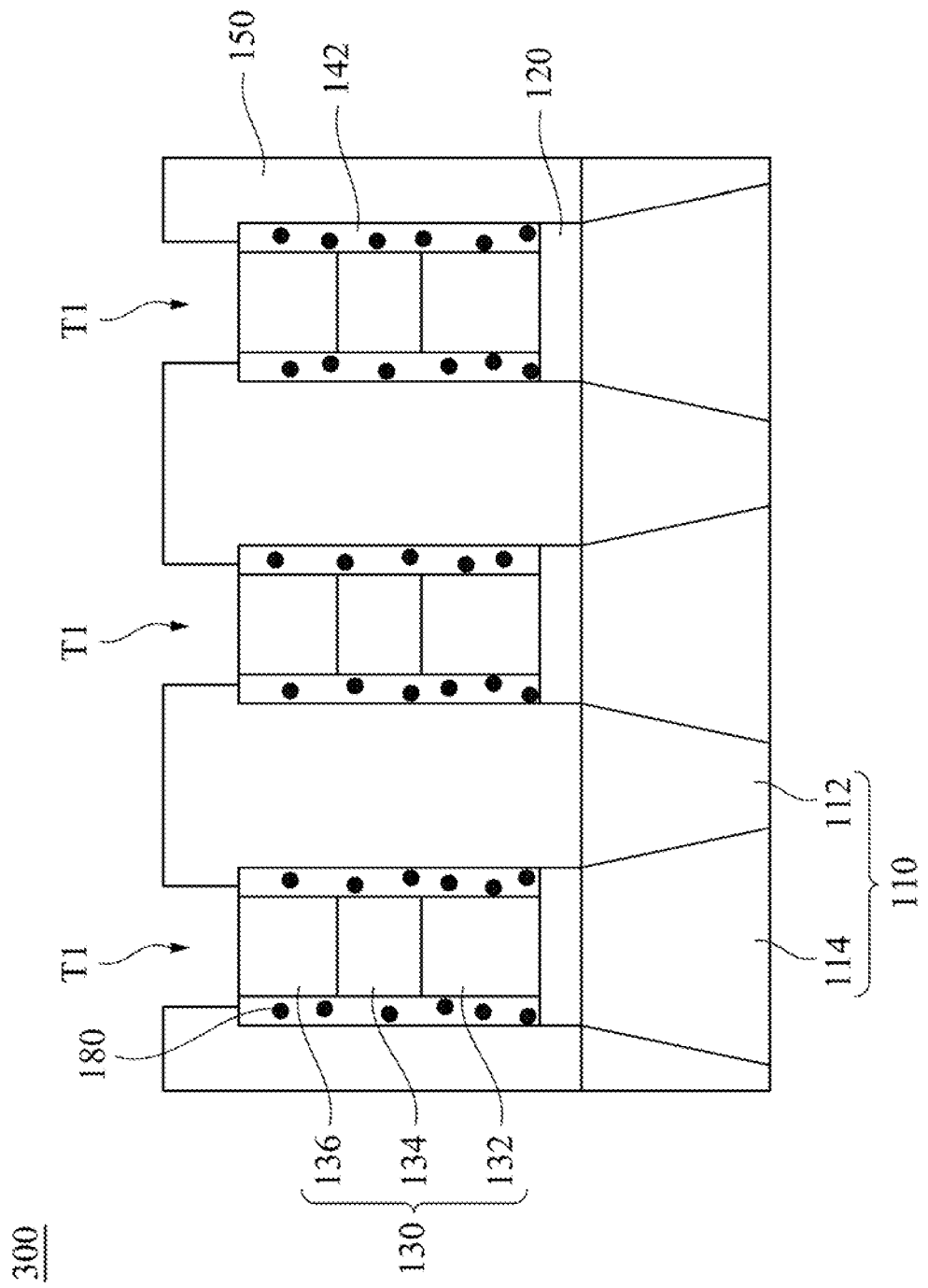
Figure 18:
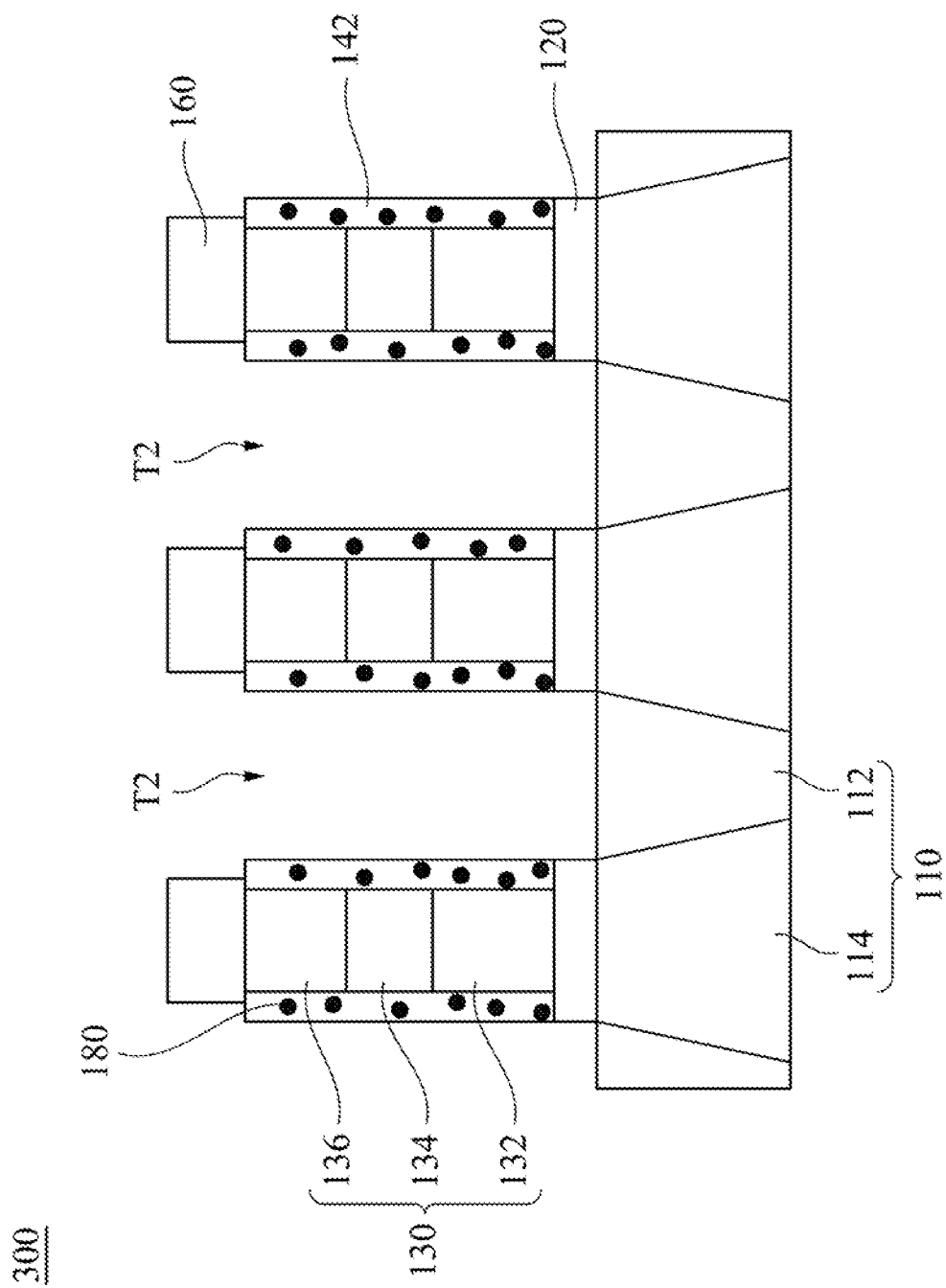
Figure 19:
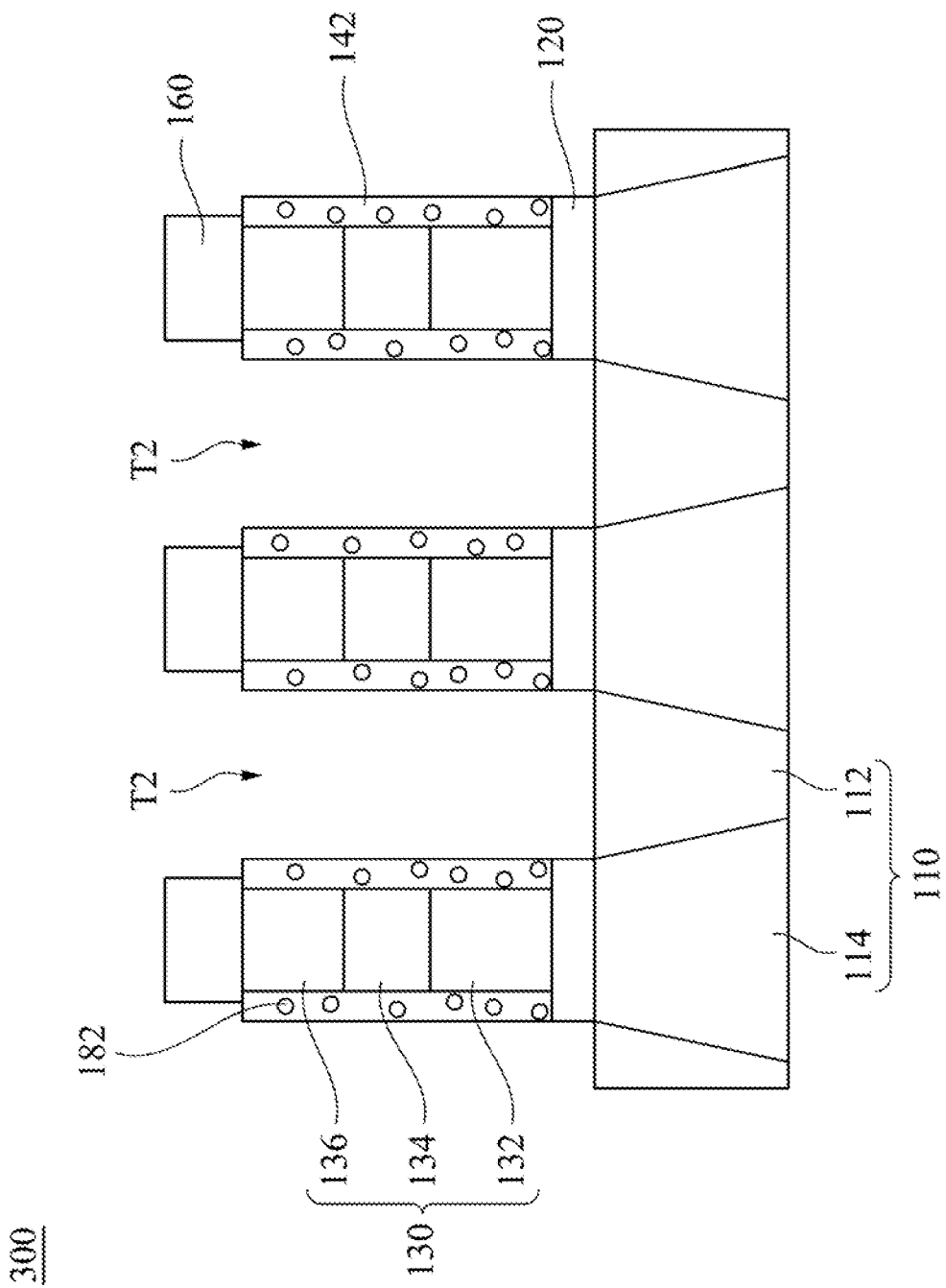

FIGS. 14-20 illustrate cross-sectional views of intermediate stages in the manufacturing process of a semiconductor device 300 in accordance with some embodiments of the present disclosure. After the structure in FIG. 1 is formed, a spacer layer 140 is conformally formed over the semiconductor structure 110 and the bitlines 130. A plurality of porogens 180 are added to the spacer layer 140 when manufacturing the semiconductor device 300. In some embodiments, a dielectric material with the porogens 180 distributed therein is deposited to form the spacer layer 140 with the porogens 180 therein. The porogens 180 are organics that are easily removed in the subsequent process. The porogens 180 are small particles evenly distributed in the spacer layer 140. In some embodiments, the diameters of the porogens 180 are in a range from about one to about two Angstrom. The structure in FIG. 14 then undergoes processes similar to that shown in FIGS. 3-6. That is, portions of the spacer layer 140 over the top surfaces of the bitlines 130 are removed and portions of the spacer layer 140 over the semiconductor structure 110 are removed to form spacers 142 adjacent to the sidewalls of the bitlines 130 as shown in FIG. 15; a sacrificial layer 150 is formed over the semiconductor structure 110 and covers the spacers 142 as shown in FIG. 16, a portion of the sacrificial layer 150 over the top surface of the bitlines 130 is etched to form first trenches T1 to expose the top surface of the bitlines 130 as shown in FIG. 17, dielectric layers 160 are formed in the first trenches T1 over the bitlines 130 and the sacrificial layer 150 is removed as shown in FIG. 18. Other details related to the process in FIGS. 14-18 are similar to or the same as the process in FIGS. 1-6; therefore, detailed descriptions are not discussed herein. It is noted that the dielectric layer 120 over the semiconductor structure 110 is removed during or after forming the spacers 142 in FIG. 15. However, the dielectric layer 120 over the semiconductive features 112 may be removed during or after removing the remaining sacrificial layer 150 instead of during or after forming the spacers 142.

After forming the dielectric layer 160 and removing the remaining sacrificial layer 150, the porogens 180 are removed to form voids 182 in the spacers 142. Therefore, a resulting porous spacer 142 is formed. The porogens 180 are removed by a thermal treatment. In the thermal treatment the spacers 142 are heated to remove the porogens 180 to form voids 182. More specifically, when the temperature in the thermal treatment reaches the boiling point of the organics of porogens 180, the organics of porogens 180 are driven away to form the voids 182 in the spacers 142. The porogens 180 are removed at a temperature that is enough to remove the porogens 180 to form the voids 182 but does not cause the damage to the semiconductor device 300 in FIG. 18. In some embodiments, the temperature of the thermal treatment is in a range of about 350° C. to about 400° C. Because the porogens 180 are evenly distributed in the spacers 142 before they are removed, the subsequently formed voids 182 are also evenly distributed in the spacers 142. The voids 182 can be used to lower the dielectric constant of the spacers 142. In some embodiments, the dielectric constant of the spacers 142 with voids 182 are in a range of about 2 to about 3. The thermal treatment is performed after removing the remaining sacrificial layer 150, so the organics of the porogens 180 are easily driven away from the second trenches T2 and the semiconductor device 300 will not be easily affected by the removal of the porogens 180. However, the thermal treatment used to remove the porogens 180 may also be performed at other suitable point of time.

Figure 20:
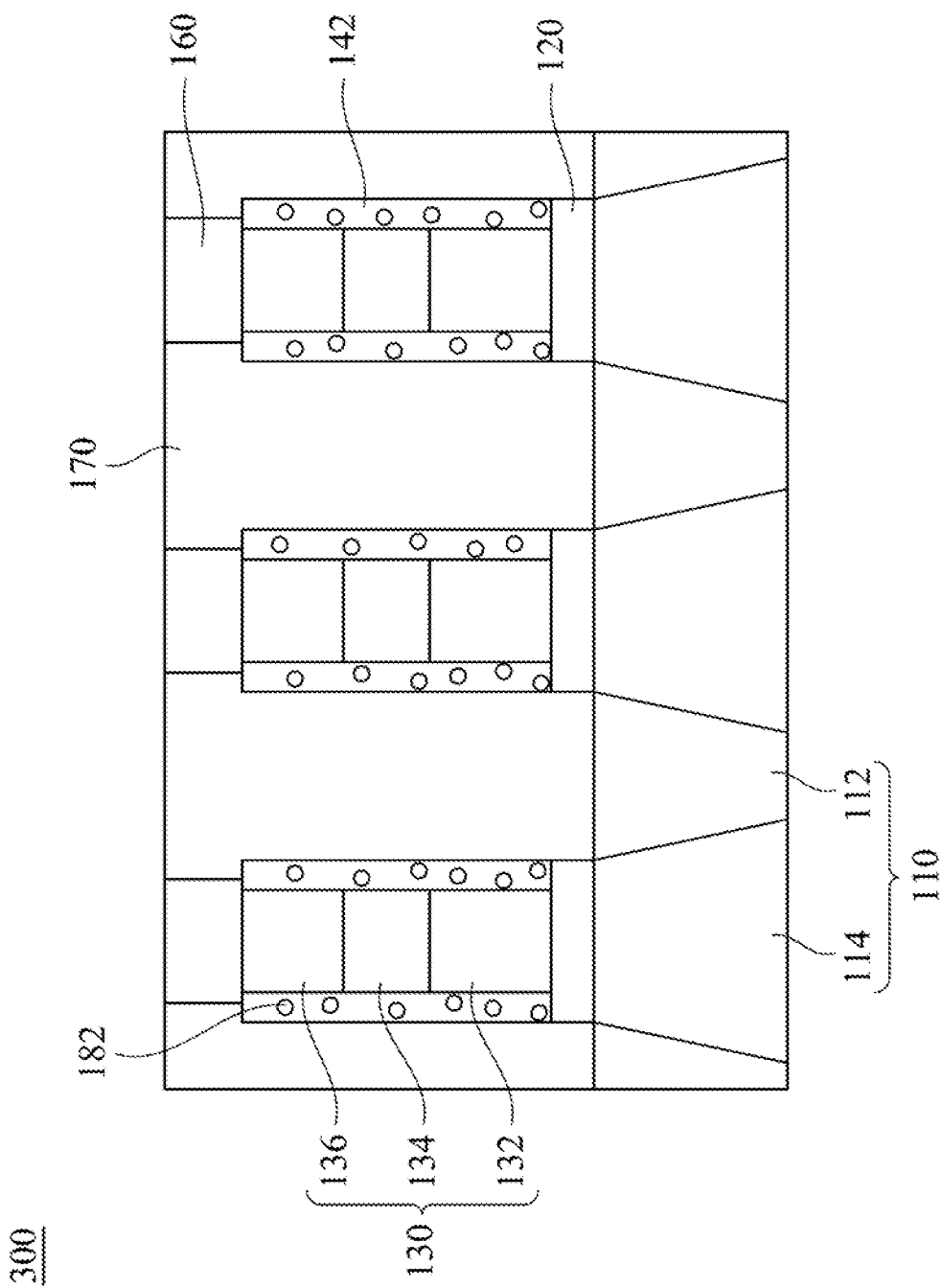

After the thermal treatment for forming the voids 182 in the spacers 142, contacts 170 are formed in the second trenches T2 and are connected to the conductive feature 112 of the semiconductor structure 110. The adjacent contacts 170 are isolated by the dielectric layer 160. Details related to the process in FIG. 20 are similar to or the same as the process in FIG. 7; therefore, detailed descriptions are not discussed herein.

The manufacturing process of the semiconductor device in the present disclosure can form low-k spacers in a simplified procedure. Therefore, the manufacturing cost of the semiconductor device can be reduced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor device, comprising:
   a semiconductor structure comprising a conductive feature therein;
   a bitline over the semiconductor structure;
   a first spacer on a sidewall of the bitline, wherein the first spacer is made of SiCO and has a plurality of voids distributed therein, and diameters of the voids are in a range from about one to about two Angstrom;
   a dielectric layer over a top surface of the bitline; and
   a contact in contact with the dielectric layer and the first spacer and connected to the conductive feature of the semiconductor structure.

2. The semiconductor device of claim 1, wherein the first spacer is a single layer.

3. The semiconductor device of claim 1, wherein the first spacer has a thickness in a range from 4 nm to 8 nm.

4. The semiconductor device of claim 1, wherein a dielectric constant of the first spacer is in a range from 2 to 3.

5. The semiconductor device of claim 1, wherein the first spacer has a carbon concentration in a range from 10% to 20%.

* * * * *